(12) United States Patent
Lee et al.

(10) Patent No.: US 8,461,696 B2
(45) Date of Patent: Jun. 11, 2013

(54) SUBSTRATE FOR SEMICONDUCTOR PACKAGE, SEMICONDUCTOR PACKAGE INCLUDING THE SAME, AND STACK PACKAGE USING THE SEMICONDUCTOR PACKAGE

(75) Inventors: Kyu Won Lee, Seoul (KR); Qwan Ho Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 685 days.

(21) Appl. No.: 12/647,953

(22) Filed: Dec. 28, 2009

(65) Prior Publication Data

US 2011/0006413 A1    Jan. 13, 2011

(30) Foreign Application Priority Data

Jul. 7, 2009   (KR) .................. 10-2009-0061750

(51) Int. Cl.
*H01L 23/12*      (2006.01)
*H01L 23/48*      (2006.01)
*H01L 29/40*      (2006.01)

(52) U.S. Cl.
USPC ............ 257/783; 257/698; 257/782; 257/686

(58) Field of Classification Search
USPC .................. 257/723, 724, 698, 701, 783, 782, 257/686
See application file for complete search history.

(56) References Cited

U.S. PATENT DOCUMENTS 6,876,554 B1 * 4/2005 Inagaki et al. ................. 361/763
7,911,047 B2 * 3/2011 Hasegawa et al. ............ 257/690

FOREIGN PATENT DOCUMENTS

| JP | 2001-144509 A | 5/2001 |
| JP | 2009-027477 A | 2/2009 |
| KR | 1020010028845 A | 4/2001 |

* cited by examiner

*Primary Examiner* — S. V. Clark
(74) *Attorney, Agent, or Firm* — Ladas & Parry LLP

(57) ABSTRACT

A substrate for a semiconductor package is provided having first and second core layers defining a cavity having an adhesive member and sized and shaped to receive a semiconductor chip. The semiconductor package further having a connection member formed on a bond finger and connected to a via pattern formed through the first and second core layers. A stack package is also provided having multiple substrates.

18 Claims, 10 Drawing Sheets

SUBSTRATE FOR SEMICONDUCTOR PACKAGE, SEMICONDUCTOR PACKAGE INCLUDING THE SAME, AND STACK PACKAGE USING THE SEMICONDUCTOR PACKAGE

CROSS-REFERENCE TO RELATED APPLICATIONS

The present application claims priority to Korean patent application number 10-2009-0061750 filed on Jul. 7, 2009, which is incorporated herein by reference in its entirety.

BACKGROUND OF THE INVENTION

The present invention relates to a semiconductor package, and more particularly, to a substrate for a semiconductor package, a semiconductor package including the same, and a stack package using the semiconductor package, which can prevent the manufacturing yield from decreasing and the overall thickness of a semiconductor package from increasing due to the use of wires.

In the semiconductor industry, packaging technology for integrated circuits has continuously been developed to satisfy the demand toward miniaturization and mounting reliability. For example, the demand for miniaturization has expedited the development of techniques for a package having a size approaching that of a chip, and the demand for mounting reliability has highlighted the importance of packaging techniques for improving the efficiency of mounting work and mechanical and electrical reliability after mounting.

As miniaturization and high performance are demanded in electric and electronic products, various techniques for providing a semiconductor module of high capacity have been researched and developed. A method for providing a semiconductor module of high capacity includes high integration of a memory chip. High integration of a memory chip can be accomplished by integrating an increased number of cells in a limited space of the semiconductor chip.

However, high integration of a memory chip requires high precision techniques, such as a fine line width, and a lengthy development period. Under these situations, a stacking technique has been suggested as another method for providing a semiconductor module of high capacity.

The stacking technique is divided into a method of embedding two stacked chips in one package and a method of stacking two separate packages which are independently packaged.

However, the method of stacking two separate packages cannot accommodate the trend toward miniaturization of electric and electronic products, and has limitations in that the overall thickness of a realized stack package is substantial. Therefore, recently, research for realizing a stack package or a multi-chip package by embedding at least two semiconductor chips in one package has actively been made.

In this regard, in the conventional art, while not illustrated in a drawing, various problems are caused as described below, due to the fact that metal wires are used to electrically connect a substrate and respective stacked semiconductor chips.

First, since a wire bonding process should be individually conducted every time when stacking a semiconductor chip, UPN (units per hour) decreases, and the total manufacturing cost increases due to the number of wires to be used and the number of bonding processes to be conducted.

Second, as the thickness of semiconductor chips gradually decreases, defects such as bouncing and cracks due to the warpage of the semiconductor chips can occur when conducting a wire bonding process, and wires are likely to be short-circuited due to a sweeping phenomenon of the wires when conducting a molding process.

Third, as the length of the wires increases depending upon the number of semiconductor chips to be stacked, difficulties exist in transmitting electric signals, and accordingly, limitations are caused in realizing a semiconductor package of a high density stack type.

Fourth, the overall thickness of a semiconductor package increases due to stacking of semiconductor chips on a substrate.

BRIEF SUMMARY OF THE INVENTION

Embodiments of the present invention are directed to a substrate for a semiconductor package, a semiconductor package including the same, and a stack package using the semiconductor package, which can prevent the manufacturing yield from decreasing and the overall thickness of a semiconductor package from increasing due to the use of wires.

In one embodiment of the present invention, a substrate for a semiconductor package comprises a first core layer having an adhesive member. The adhesive member may be applied onto the first core layer, for example. A second core layer is joined to an upper surface of the first core layer including the adhesive member, defining a cavity which delimits a region where a semiconductor chip is to be attached and exposes the adhesive member. The cavity may be quadrangular in shape, for example. One or more bond fingers adjoin the cavity and one or more via patterns formed through the first and second core layers are connected to the bond fingers. One or more ball lands are disposed on a lower surface of the first core layer and connection members are formed on the bond fingers.

The bond fingers may be formed on two neighboring sides of the quadrangular cavity, for example.

The bond fingers may be formed to extend from portions of an upper surface of the second core layer which adjoin the quadrangular cavity to portions of a side surface of the second core layer which defines the quadrangular cavity, for example.

The bond fingers may be formed such that lower ends of the bond fingers, which are formed on the side surface of the second core layer in the quadrangular cavity, are positioned at a distance of 1~20 μm above an upper surface of the semiconductor chip, for example.

The adhesive members may be applied to have a size corresponding to 90~110% of a size of the semiconductor chip, for example.

The connection members may have a width and a length that respectively correspond to 80~100% and 60~95% of a width and a length respectively of the bond fingers, for example.

The connection members may have a height of 20~30 μm, for example.

In another embodiment of the present invention, a semiconductor package comprises a substrate having a first core layer having an adhesive member. The adhesive member may be applied onto the first core layer, for example. A second core layer is joined to an upper surface of the first core layer including the adhesive member, defining a cavity which delimits a region where a semiconductor chip is to be attached and exposes the adhesive member. The cavity may be quadrangular in shape, for example. One or more bond fingers are adjoining the cavity and one or more via patterns formed through the first and second core layers are connected to the bond fingers. One or more ball lands are disposed on a lower surface of the first core layer and connection members are formed on the bond fingers. An encapsulant member is formed to cover the upper surface of the first core layer including the semiconductor chip attached in the cavity.

The bond fingers may be formed on two neighboring sides of the quadrangular cavity, for example.

The bond fingers may be formed to extend from portions of an upper surface of the second core layer which adjoin the quadrangular cavity to portions of a side surface of the second core layer which defines the quadrangular cavity.

The bond fingers may be formed such that lower ends of the bond fingers, which are formed on the side surface of the second core layer in the quadrangular cavity, are positioned at a distance of 1~20 μm above an upper surface of the semiconductor chip, for example.

The adhesive members may be applied to have a size corresponding to 90~110% of a size of the semiconductor chip, for example.

The semiconductor chip may be disposed close to the side surface of the quadrangular cavity on which the bond fingers are formed, for example.

The semiconductor package may further comprise external electrode terminals attached to the ball lands which are disposed on the lower surface of the first core layer, for example.

The semiconductor package may further comprise a dummy external electrode terminal attached to the lower surface of the first core layer to which the external electrode terminals are attached, to perform a balancing function for example.

The dummy external electrode terminal for performing the balancing function may be attached to a corner portion of the lower surface of the first core layer which diagonally faces a corner between two edges adjacent to which the external electrode terminals are attached, for example.

The encapsulant member may comprise an EMC (epoxy molding compound) or an epoxy type black film, for example.

In another embodiment of the present invention, a stack package comprises at least two unit packages which are vertically stacked; each unit package comprising a substrate having a first core layer having an adhesive member. The adhesive member may be applied onto the first core layer, for example. A second core layer is joined to an upper surface of the first core layer including the adhesive member, defining a cavity which delimits a region where a semiconductor chip is to be attached and exposes the adhesive member. The cavity may be quadrangular in shape, for example. One or more bond fingers are adjoining the cavity and one or more via patterns formed through the first and second core layers are connected to the bond fingers. One or more ball lands are disposed on a lower surface of the first core layer and connection members are formed on the bond fingers. An encapsulant member is formed to cover the upper surface of the first core layer including the semiconductor chip attached in the cavity. Electrical connection among the stacked unit packages is implemented in such a way that bond fingers of a lower unit package and corresponding ball lands of an upper unit package are connected with each other by the medium of connection members which are formed on the bond fingers of the lower unit package.

The stack package may further comprise external electrode terminals attached to ball lands of a lowermost unit package among the stacked unit packages, for example.

The stack package may further comprise a dummy external electrode terminal attached to a lower surface of the lowermost package unit to which the external electrode terminals are attached, to perform a balancing function for example.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
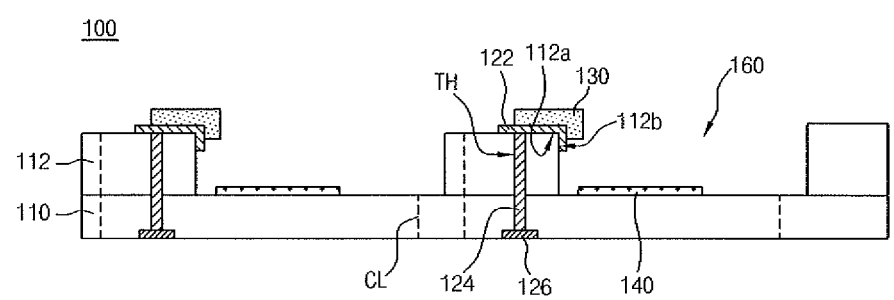
FIG. 1 is a cross-sectional view illustrating a substrate for a semiconductor package in accordance with an embodiment of the present invention.
Figure 2A:
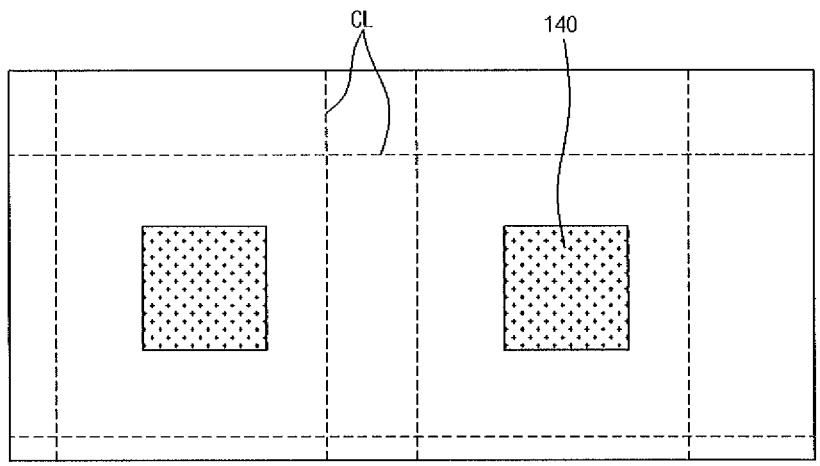
FIGS. 2A and 2B are plan views respectively illustrating a first core layer and a second core layer of the substrate for a semiconductor package in accordance with an embodiment of the present invention.
Figure 2B:
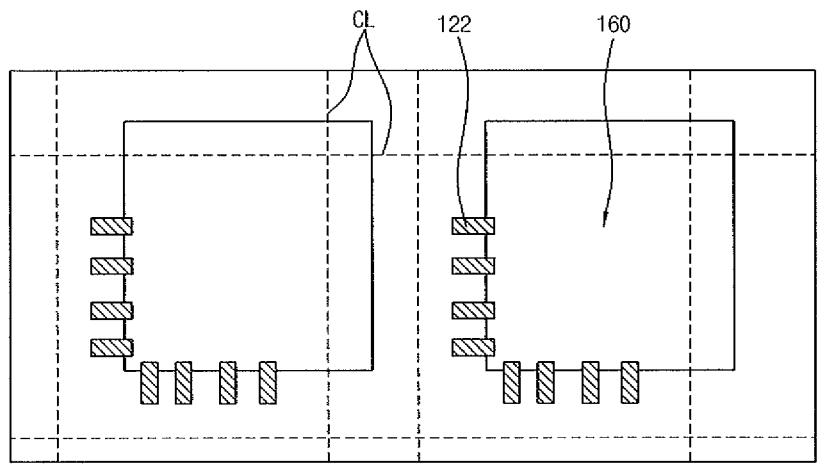

FIG. 1 is a cross-sectional view illustrating a substrate for a semiconductor package in accordance with an embodiment of the present invention, and FIGS. 2A and 2B are plan views respectively illustrating a first core layer and a second core layer of the substrate for a semiconductor package in accordance with an embodiment of the present invention.

Referring to these drawings, a substrate 100 for a semiconductor package in accordance with an embodiment of the present invention has a structure in which a first core layer 110 and a second core layer 112 are joined to each other and a plurality of via patterns 124 are formed in the first and second core layers 110 and 112 to pass through them. The first core layer 110 and the second core layer 112 constitute the body of the substrate 100. For example, FR4 (flame retardant type 4) can be used as the material of the first core layer 110 and the second core layer 112.

The first core layer 110 has an upper surface and a lower surface which faces away from the upper surface, and includes adhesive members 140 which are applied to portions of the upper surface where semiconductor chips are to be attached. The adhesive members 140 can include polymer resin that enables semiconductor chips to be attached to the upper surface of the first core layer 110 at a room temperature, for example. The polymer resin can be applied through stencil printing and then dried, for example. The adhesive members 140 may be applied to have a size corresponding to 90~110% of the size of the semiconductor chips, for example.

The second core layer 112 has cavities 160 which delimit regions where the semiconductor chips are to be attached and expose the adhesive members 140 applied to the upper surface of the first core layer 110, and includes a plurality of bond fingers 122 which are formed abutting the cavities 160.

The cavities 160 are defined in the form of quadrangular holes which pass through the second core layer 112. Preferably, the quadrangular cavities 160 are defined to have a size greater than that of the semiconductor chips to be attached therein. While the depth of the cavities 160 is determined by the thickness of the second core layer 112, the cavities 160 have a depth greater than the thickness of the semiconductor chips to be attached therein.

The bond fingers 122 are formed on two neighboring sides of each quadrangular cavity 160 in such a way as to extend from portions of an upper surface 112a of the second core layer 112 which adjoin the cavity 160 to portions of a side surface 112b of the second core layer 112 which defines the cavity 160. The bond fingers 122 may be formed such that the lower ends of the bond fingers 122, which are formed on the side surface 112b of the second core layer 112 in the quadrangular cavity 160, are positioned at a distance of 1~20 μm above the upper surface of the semiconductor chip so as to ensure stable electrical connection between the bond fingers 122 and bonding pads of the semiconductor chip when the semiconductor chip is attached to the first core layer 110 in the cavity 160.

Connection members 130 are respectively formed on the bond fingers 122. The connection members 130 are formed to electrically connect the bond fingers 122 of the substrate 100 and the bonding pads of the semiconductor chip. The connection members 130 may be formed to have a width and a length that respectively correspond to 80~100% and 60~95% of the width and the length of the bond fingers 122, for example. Also, the connection members 130 may be formed to have a height of 20~30 μm, for example.

The via patterns 124 are formed in through-holes TH which are defined to pass through the first and second core layers 110 and 112 joined to each other. For example, the through-holes TH can be defined through laser drilling or an etching process. The via patterns 124 have one end which is electrically connected to corresponding bond fingers 122. The via patterns 124 include ball lands 126 which are formed on the lower surface of the first core layer 110 to be connected to the other ends of the via patterns 124.

In FIGS. 1, 2A and 2B, the reference symbol CL designates cutting lines for the production of single products.

Figure 3:
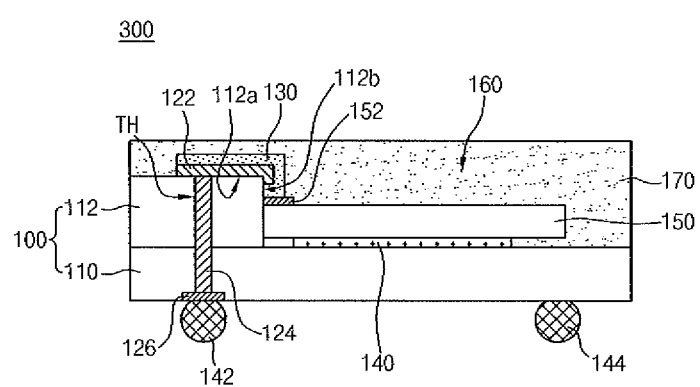
FIG. 3 is a cross-sectional view illustrating a semiconductor package in accordance with another embodiment of the present invention.

FIG. 3 is a cross-sectional view illustrating a semiconductor package in accordance with another embodiment of the present invention, which has a substrate as described above.

Referring to FIG. 3, in a semiconductor package 300 in accordance with another embodiment of the present invention, a substrate 100, having a structure in which a first core layer 110 and a second core layer 112 are joined to each other, is prepared. The second core layer 112 has a cavity 160 of a quadrangular hole shape. Bond fingers 122 are formed on the second core layer 112 in such a way as to extend from portions of an upper surface 112a of the second core layer 112 which adjoin the cavity 160 to portions of a side surface 112b of the second core layer 112 which defines the cavity 160. The first core layer 110 has an adhesive member 140 which is applied to a portion of the first core layer 110 which is exposed through the cavity 160.

The substrate 100 includes via patterns 124 which are formed in through-holes TH defined to pass through the first and second core layers 110 and 112. The via patterns 124 include ball lands 126 which are disposed on the lower surface of the first core layer 110. Therefore, the via patterns 124 have one end which is connected to the bond fingers 122 formed on the upper surface 112a of the second core layer 112 and the other end which is connected to the ball lands 126.

A semiconductor chip 150 is attached to the first core layer 110 by the medium of the adhesive member 140 in the cavity 160 defined in the second core layer 112 of the substrate 100. The semiconductor chip 150 has a plurality of bonding pads 152 and is attached in a face-up type. The bonding pads 152 are arranged adjacent to the edges of the semiconductor chip 150 which face the side surface 112b of the second core layer 112 in the cavity 160, through a pad realignment process.

In detail, the bonding pads 152 are aligned with the bond fingers 122 on the same lines. At this time, the bond fingers 122 of the substrate 100 may be formed such that the lower ends of the bond fingers 122, which are formed on the side surface 112b of the second core layer 112 in the cavity 160, are positioned at a distance of 1~20 μm above the upper surface of the semiconductor chip 150, for example. This is to secure a space for insertion of the semiconductor chip 150 when attaching the semiconductor chip 150 to the first core layer 110 and allow the bond fingers 122 and the bonding pads 152 to be easily connected with each other.

As the adhesive member 140, for example, polymer resin having excellent adhesion properties at a room temperature can be used. The adhesive member 140 may be applied to have a size corresponding to 90~110% of the size of the semiconductor chip 150, for example.

The bond fingers 122 of the substrate 100 and the bonding pads 152 of the semiconductor chip 150 may be electrically connected in one-to-one correspondence with each other by connection members 130. The connection members 130 are formed on the bonding fingers 122 of the substrate 100. Then, during a reflow process, the connection members 130 flow downward on the bonding fingers 122 due to a high temperature and connect the bond fingers 122 of the substrate 100 and the bonding pads 152 of the semiconductor chip 150. For example, the connection members 130 may contain solder. Before conducting the reflow process, the connection members 130 may be formed to have a width and a length respectively corresponding to 80~100% and 60~95% of the width and the length of the bond fingers 122, for example. Also, the connection members 130 may be formed to a height of 20~30 μm, for example.

External electrode terminals 142 are attached to the ball lands 126 which are disposed on the lower surface of the first core layer 110. For example, the external electrode terminals 142 may include solder balls. Accordingly, electrical signals of an external circuit can be inputted to and outputted from the semiconductor chip 150 through the external electrode terminals 142 attached to the ball lands 126 by the medium of the bond fingers 122 and the via patterns 124 of the substrate 100.

In addition to the external electrode terminals 142 serving to transmit input and output signals, a dummy external electrode terminal 144 may be attached to the lower surface of the first core layer 110. The dummy external electrode terminal 144 is formed to balance the semiconductor package 300. As will be described later in detail, the dummy external electrode terminal 144 may be attached to a corner portion of the lower surface of the first core layer 110 which diagonally faces the corner between two edges adjacent to which the external electrode terminals 142 are attached, for example. The dummy external electrode terminal 144 for balancing the semiconductor package 300 serves as a virtual external electrode terminal which is electrically insulated. The dummy external electrode terminal 144 for the balancing purpose can include, for example, a solder ball.

An encapsulant member 170 is formed to seal the upper surfaces of the first core layer 110 and the second core layer 112 which include the semiconductor chip 150 attached in the cavity 160. For example, the encapsulant member 170 can include an EMC (epoxy molding compound) or an epoxy type black film. Unlike the EMC, the epoxy type black film can be formed through a reflow process in such a way as to apply strong coupling force to the first and second core layers 110 and 112. Thus, in the case where the epoxy type black film is used as the encapsulant member 170, a separate molding process is not needed.

As described above, in the semiconductor package according to an embodiment of the present invention, since a semiconductor chip is inserted into a substrate, the overall thickness of the semiconductor package can be reduced when compared to the conventional art.

Also, in the semiconductor package according to an embodiment of the present invention, because bond fingers and bonding pads are directly bonded with each other by the medium of connection members, bonding elements such as bonding wires are not needed. Accordingly, since a wire bonding process can be omitted, manufacturing processes can be simplified, whereby the manufacturing yield can be improved and the manufacturing cost can be decreased.

In addition, in the semiconductor package according to an embodiment of the present invention, due to the fact that the bond fingers of the substrate and the bonding pads of the semiconductor chip are directly connected with each other by the connection members such as solder, electric signal transmission lengths can be uniformized, whereby the electrical characteristics of the semiconductor package can be improved.

Hereafter, a method for manufacturing the semiconductor package in accordance with the embodiment of the present invention will be described with reference to FIGS. 4A through 4E and FIGS. 5A through 5E.

Figure 4A:
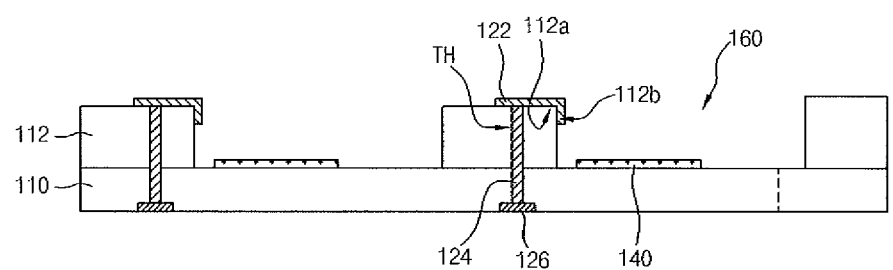
FIGS. 4A through 4E are cross-sectional views illustrating the processes of a method for manufacturing the semiconductor package in accordance with an embodiment of the present invention.
Figure 5A:
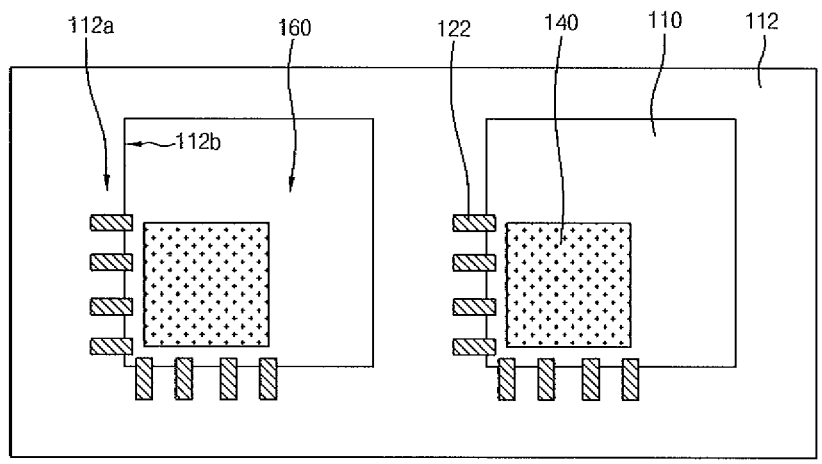
FIGS. 5A through 5E are plan views illustrating the processes of the method for manufacturing the semiconductor package in accordance with an embodiment of the present invention.

Referring to FIGS. 4A and 5A, adhesive members 140 are formed on the upper surface of a first core layer 110. The adhesive members 140 are formed on portions of the first core layer 110 where semiconductor chips are to be subsequently attached. The adhesive members 140 my be formed to have a size corresponding to 90~110% of the size of the semiconductor chips, for example. For example, the adhesive members 140 can be formed by applying and annealing polymer resin that has excellent adhesion properties. Annealing of the adhesive members 140 may be conducted at a temperature of 180~250° C., for example.

A second core layer 112, which has cavities 160 and a plurality of bond fingers 122, are joined to the first core layer 110 including the adhesive members 140. The second core layer 112 may be joined such that the cavities 160 thereof expose the adhesive members 140. The cavities 160 are defined to have a size greater than that of the semiconductor chips to be subsequently attached to the first core layer 110 therein. For example, the cavities 160 may be defined to have a quadrangular hole shape. The bond fingers 122 may be formed on two neighboring sides of each quadrangular cavity 160. The bond fingers 122 may be formed in such a way as to extend from portions of an upper surface 112a of the second core layer 112 which adjoin the cavity 160 to portions of a side surface 112b of the second core layer 112 which defines the cavity 160. The bond fingers 122 may be formed such that the lower ends of the bond fingers 122, which are formed on the side surface 112b of the second core layer 112 in the cavity 160, are positioned at a distance of 1~20 μm above the upper surface of the semiconductor chip to be subsequently attached, for example.

Through-holes TH may be defined to pass through the first core layer 110 and the second core layer 112 which are joined to each other. Then, by filling a metallic material in the through-holes TH, a plurality of via patterns 124 are formed. The through-holes TH can be defined through laser drilling or an etching process, for example. The through-holes TH may be defined at positions corresponding to the bond fingers 122. Therefore, the via patterns 124 have one end which is connected to corresponding bond fingers 122. Ball lands 126 are formed on the lower surface of the first core layer 110 where the other end of the via patterns 124 is disposed. The ball lands 126 are formed along with the via patterns 124. Accordingly, the ball lands 126 can be understood as parts of the via patterns 124 and as being connected to the other ends of the via patterns 124.

Figure 4B:
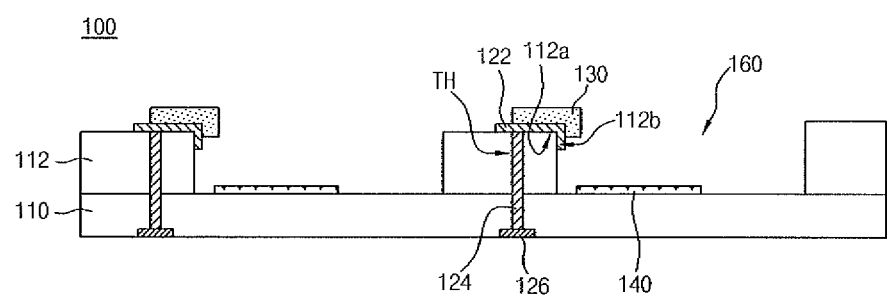
Figure 5B:
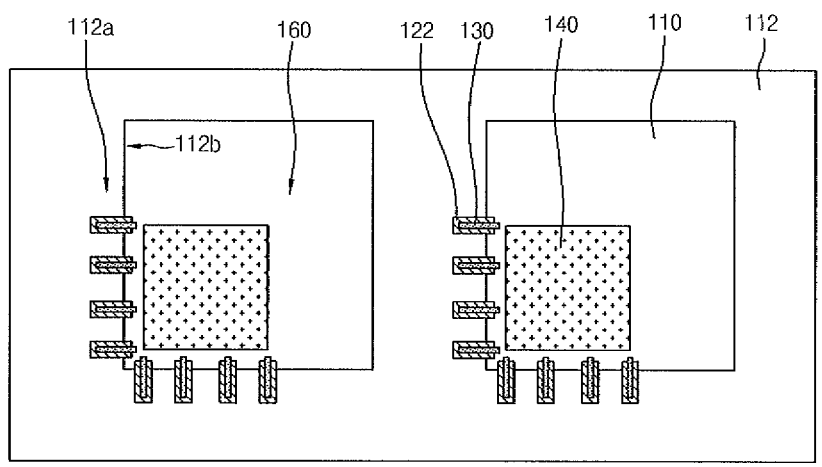

Referring to FIGS. 4B and 5B, connection members 130 are formed on the bond fingers 122 which are formed on the second core layer 112. The connection members 130 are formed on the bond fingers 122. The connection members 130 include, for example, solder. The connection members 130 may be formed to have a width and a length that respectively correspond to 80~100% and 60~95% of the width and the length of the bond fingers 122, for example. Also, the connection members 130 may be formed to have a height of 20~30 μm, for example.

Through the above-mentioned processes, substrates 100 for semiconductor packages, in which the first core layer 110 including the adhesive members 140 and the second core layer 112 including the cavities 160 and the bond fingers 122 are joined, are manufactured.

Figure 4C:
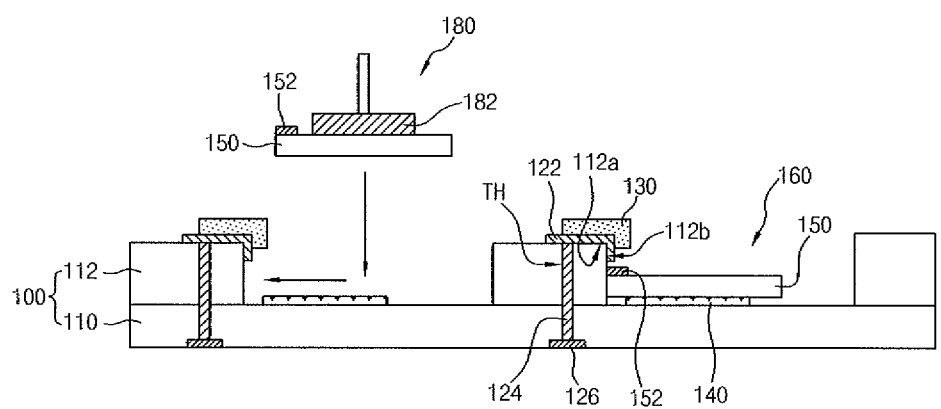
Figure 5C:
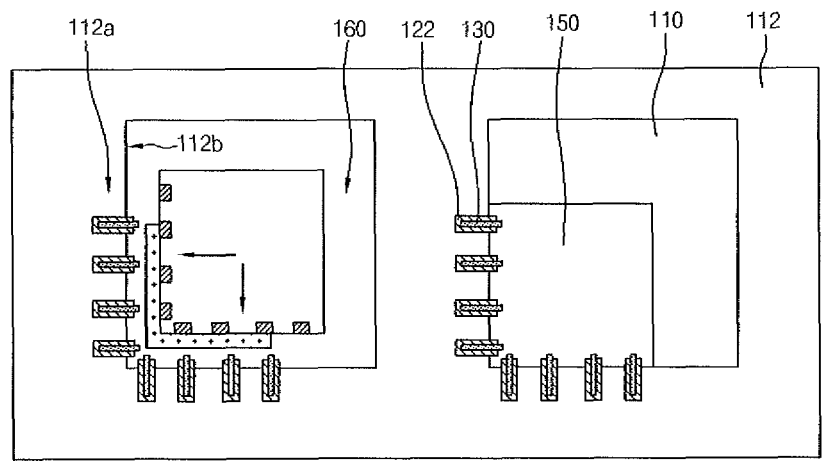

Referring to FIGS. 4C and 5C, a bond head 180 is aligned above the substrate 100 for a semiconductor package, including the first core layer 110 and the second core layer 120 which has the cavity 160 and is joined to the first core layer 110. The bond head 180 includes a pick-up rubber 182. A semiconductor chip 150 is picked up by the pick-up rubber 182. The semiconductor chip 150 has a plurality of bonding pads 152. The bonding pads 152 are disposed on a surface of the semiconductor chip 150 which faces away from the first and second core layers 110 and 112. The bonding pads 152 are arranged, through a realignment process, at positions that are vertically aligned with the bond fingers 122 which are disposed on the side surface 112b of the second core layer 112 in the cavity 160.

The picked-up semiconductor chip 150 is inserted into the cavity 160 in such a way as to contact the two neighboring sides of the cavity 160 on which the bond fingers 122 are placed. The semiconductor chip 150 is disposed close to the side surface 112b of the quadrangular cavity 160 on which the bond fingers 122 are formed. Here, the process for inserting the semiconductor chip 150 can be conducted through downward and horizontal movement of the bond head 180, for example.

When the semiconductor chip 150 contacts the adhesive member 140 by inserting the semiconductor chip 150, the semiconductor chip 150 is firmly attached to the first core layer 110 by the medium of the adhesive member 140 through pressing at a room temperature, for example. In succession, when the attachment of the semiconductor chip 150 is completed, the processes for inserting the other semiconductor chips 150 into the cavities 160 and pressing the semiconductor chips 150 at a room temperature may be repeatedly conducted in the same manner.

In the process for attaching the semiconductor chip 150 to the substrate 100 for a semiconductor package, since the lower ends of the bond fingers 122, which are formed on the side surface 112b of the second core layer 112 in the cavity 160, may be positioned at a distance of 1~20 μm above the upper surface of the semiconductor chip 150, a space for inserting the semiconductor chip 150 is secured, whereby it is possible to prevent the occurrence of bonding defects.

Figure 4D:
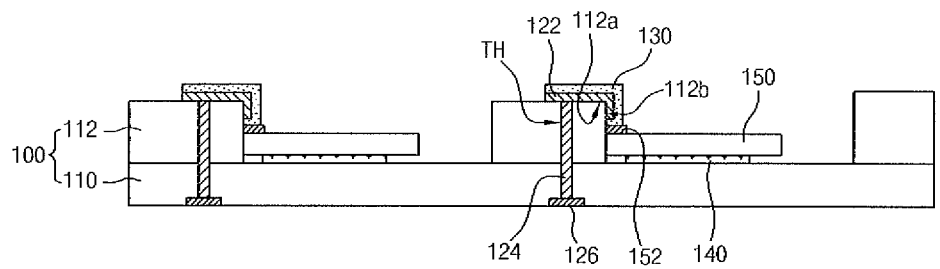
Figure 5D:
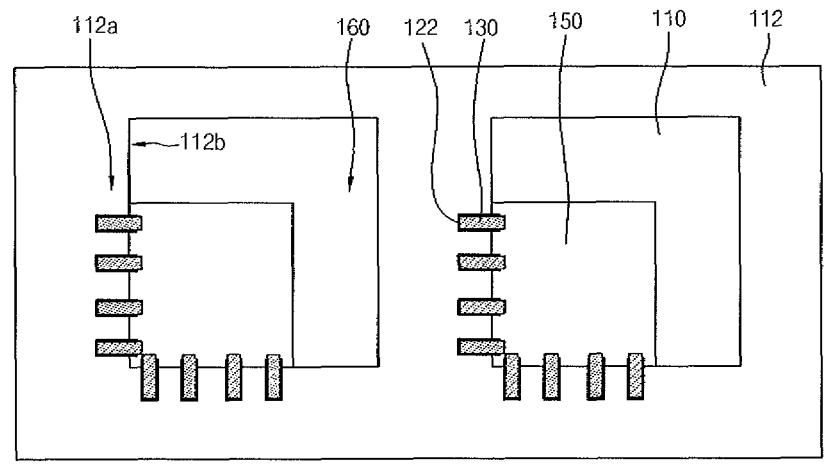

Referring to FIGS. 4D and 5D, a reflow process is conducted for the resultant structure. During the reflow process, the connection members 130 which are formed on the bond fingers 122 flow downward toward the bonding pads 152. Then, as the connection members 130 are set with the lapse of time, the bond fingers 122 and the bonding pads 152 are electrically connected with each other.

Figure 4E:
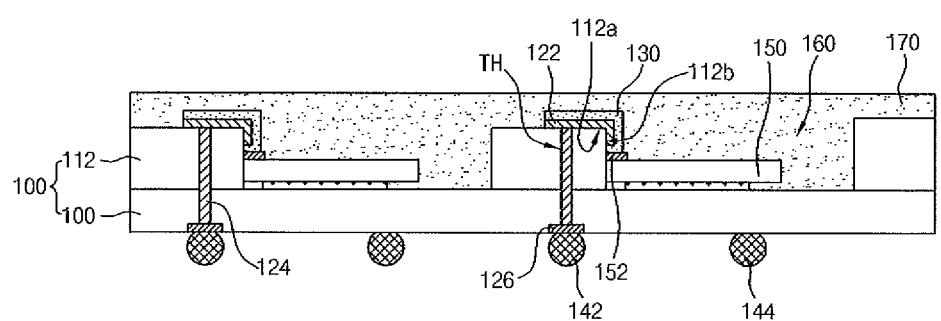
Figure 5E:
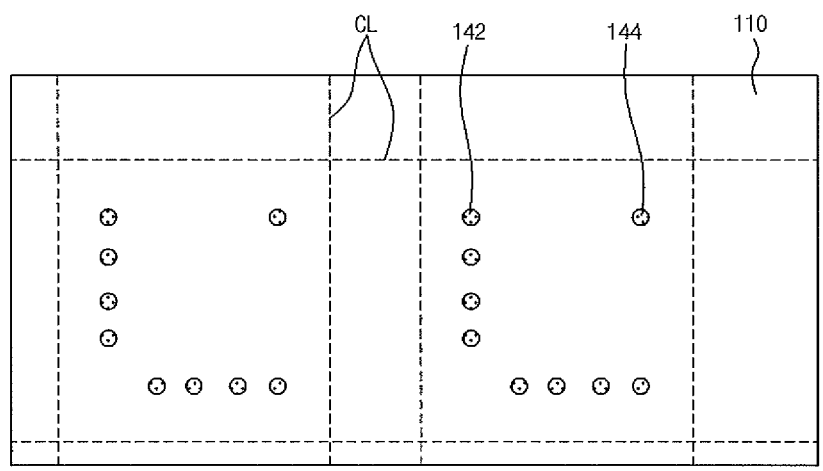

Referring to FIGS. 4E and 5E, an encapsulant member 170 is formed to seal the upper surfaces of the first core layer 110 and the second core layer 112 which include the semiconductor chips 150 attached in the cavities 160. For example, the encapsulant member 170 can include any one of an EMC (epoxy molding compound) and an epoxy type black film. Unlike the EMC, the epoxy type black film can be easily formed through a reflow process to apply strong coupling force to the first and second core layers 110 and 112, and can provide excellent markability due to possession of block color. Also, unlike the EMC, since the epoxy type black film does not need a molding frame, the initial investment cost can be reduced.

External electrode terminals 142 are respectively attached to the ball lands 126 which are disposed on the lower surface of the first core layer 110 of the substrate 100. When attaching the external electrode terminals 142, a dummy external electrode terminal 144 for performing a balancing function may be attached as well to the lower surface of the first core layer 110.

FIG. 5E is a plan view illustrating the lower surface of the first core layer 110. As can be readily seen from FIG. 5, the dummy external electrode terminal 144 for performing a balancing function may be attached to a corner portion of the lower surface of the first core layer 110 which diagonally faces the corner between two edges adjacent to which the external electrode terminals 142 are attached. The dummy external electrode terminal 144 for performing the balancing function serves as a virtual external electrode terminal which is electrically insulated. The plurality of external electrode terminals 142 and the dummy external electrode terminal 144 for performing the balancing function include, for example, solder balls.

Thereafter, while not shown in a drawing, a sawing process may be conducted for the respective semiconductor chips 150, by which a plurality of semiconductor packages are manufactured.

Figure 6:
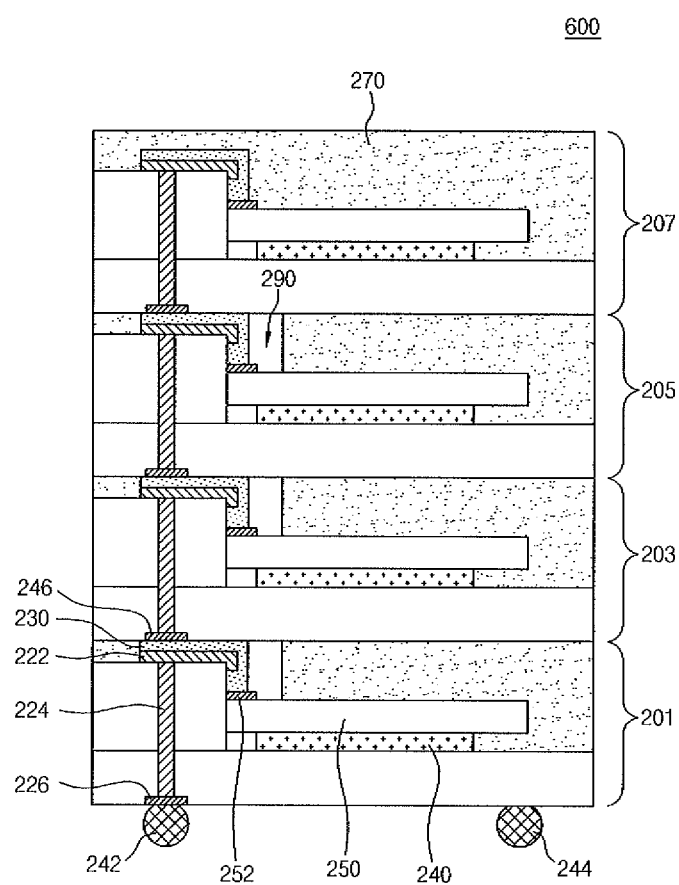
FIG. 6 is a cross-sectional view illustrating a stack package in accordance with another embodiment of the present invention.

FIG. 6 is a cross-sectional view illustrating a stack package in accordance with another embodiment of the present invention. The stack package will be described below. Explanations to be repeated when compared to FIG. 3 will be omitted herein.

Referring to FIG. 6, a stack package 600 in accordance with another embodiment of the present invention includes two or more unit packages 201, 203, 205 and 207 which are stacked in the vertical direction. Among the stacked unit packages 201, 203, 205 and 207, the lowermost unit package 201 can have a plurality of external electrode terminals 242 which are attached to ball lands 226 and a dummy external electrode terminal 244 for performing a balancing function.

The unit packages 201, 203, 205 and 207 have the same construction as the semiconductor package 300 shown in FIG. 3. The electrical connection among the stacked unit packages 201, 203, 205 and 207 can be implemented in such a way that bond fingers 222 of a lower unit package, for example, the unit package 201, and corresponding ball lands 246 of an upper unit package, for example, the unit package 203, are connected with each other by the medium of connection members 230 such as solder which are formed on the bond fingers 222 of the lower unit package.

The stacked unit packages 201, 203, 205 and 207 include encapsulant members 270 which are formed to seal one surface of the unit packages 201, 203, 205 and 207 except openings 290 which expose the ball lands 246 of the upper unit package and the bond fingers 222 of the lower unit package disposed to face each other. The encapsulant members 270 may include epoxy type black films, for example.

The stack package 600 according to the present invention can be realized by stacking the unit packages 201, 203, 205 and 207 and then sealing the unit packages all together using an encapsulant member 270. At this time, the encapsulant member 270 may include an EMC.

In the above-described stack package according to an embodiment of the present invention, since respective semiconductor chips are inserted into cavities defined in second core layers of substrates, the overall thickness of the stack package can be reduced. Also, because bond fingers and bonding pads are electrically connected directly with each other by the medium of solder, it is possible to prevent the processing time from increasing and the manufacturing yield from decreasing due to the use of wires.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A substrate for a semiconductor package, comprising:
a first core layer;
an adhesive member applied onto the first core layer;
a second core layer joined to an upper surface of the first core layer including the adhesive member, defining a cavity sized and shaped to receive a semiconductor chip and exposing the adhesive member, and having at least one bond finger adjoining the cavity; and
at least one via pattern formed through the first and second core layers to be connected to the bond finger, and having at least one ball land disposed on a lower surface of the first core layer, wherein the adhesive member is of a size corresponding to 90~110% of the size of the semiconductor chip.

2. The substrate according to claim 1, further comprises a connection member formed on the bond finger.

3. The substrate according to claim 1, wherein the at least one bond fingers are formed on two neighboring sides of the cavity.

4. The substrate according to claim 1, wherein the bond finger is formed to extend from a portion of an upper surface of the second core layer which adjoins the cavity to a portion of a side surface of the second core layer which defines the cavity.

5. The substrate according to claim 4, wherein the bond finger is formed such that lower end of the bond finger, which is formed on the side surface of the second core layer in the cavity, is positioned at a distance of 1~20 μm above an upper surface of the semiconductor chip.

6. The substrate according to claim 2, wherein the connection member has a width and a length that respectively corresponds to 80~100% and 60~95% of a width and a length of the bond finger.

7. The substrate according to claim 2, wherein the connection member has a height of 20~30 μm.

8. A semiconductor package comprising:
a substrate including:

a first core layer, an adhesive member applied onto the first core layer, a second core layer joined to an upper surface of the first core layer including the adhesive member, defining a cavity sized and shaped to receive a semiconductor chip and exposing the adhesive member, and having at least one bond finger adjoining the cavity, at least one via pattern formed through the first and second core layers to be connected to the bond finger, and having at least one ball land disposed on a lower surface of the first core layer, and a connection member formed on the bond finger; and the semiconductor chip attached to the first core layer in the cavity by the medium of the adhesive member, and having a bonding pad at a position corresponding to the bond finger, the bond finger and bonding pad being electrically connected with each other by the connection member, wherein the adhesive member is of a size corresponding to 90~110% of the size of the semiconductor chip.

9. The substrate according to claim 8, further comprises an encapsulant member formed to cover the upper surface of the first core layer including the semiconductor chip attached in the cavity.

10. The semiconductor package according to claim 8, wherein the at least one bond fingers are formed on two neighboring sides of the cavity.

11. The semiconductor package according to claim 8, wherein the bond finger is formed to extend from a portion of an upper surface of the second core layer which adjoins the cavity to a portion of a side surface of the second core layer which defines the cavity.

12. The semiconductor package according to claim 11, wherein the bond finger is formed such that a lower end of the bond finger, which is formed on the side surface of the second core layer in the cavity, is positioned at a distance of 1~20 μm above an upper surface of the semiconductor chip.

13. The semiconductor package according to claim 8, wherein the semiconductor chip is disposed close to the side surface of the cavity on which the bond finger is formed.

14. The semiconductor package according to claim 8, further comprising:

an external electrode terminal attached to the ball land which is disposed on the lower surface of the first core layer; and a dummy external electrode terminal attached to the lower surface of the first core layer to which the external electrode terminal is attached, to perform a balancing function.

15. The semiconductor package according to claim 14, wherein the dummy external electrode terminal for performing the balancing function is attached to a corner portion of the lower surface of the first core layer which diagonally faces a corner between two edges adjacent to which the external electrode terminal is attached.

16. The semiconductor package according to claim 9, wherein the encapsulant member comprises an EMC (epoxy molding compound) or an epoxy type black film.

17. A stack package comprising:

at least two unit packages which are vertically stacked;

each unit package comprising a substrate including a first core layer, an adhesive member applied onto the first core layer, a second core layer joined to an upper surface of the first core layer including the adhesive member, defining a cavity sized and shaped to receive a semiconductor chip and exposing the adhesive member, and having at least one bond finger adjoining the cavity, at least one via pattern formed through the first and second core layers to be connected to the bond finger, and having at least one ball land disposed on a lower surface of the first core layer, and a connection member formed on the bond finger, the semiconductor chip attached to the first core layer in the cavity by the medium of the adhesive member, and having a bonding pad at a position corresponding to the bond finger, the bond finger and bonding pad being electrically connected with each other by the connection member, and an encapsulant member formed to cover the upper surface of the first core layer including the semiconductor chip attached in the cavity, wherein electrical connection among the stacked unit packages is implemented in such a way that the bond finger of a lower unit package and a corresponding ball land of an upper unit package are connected with each other by the medium of the connection member formed on the bond finger of the lower unit package.

18. The stack package according to claim 17, further comprising:

an external electrode terminal attached to the ball land of a lowermost unit package among the stacked unit packages; and a dummy external electrode terminal attached to a lower surface of the lowermost package unit to which the external electrode terminal is attached, to perform a balancing function.

* * * * *